(12) United States Patent
Zhao et al.

(10) Patent No.: US 8,749,067 B2
(45) Date of Patent: Jun. 10, 2014

(54) SEMICONDUCTOR DEVICE AND METHOD FOR FORMING THE SAME

(75) Inventors: Chao Zhao, Kellel-Lo (BE); Wenwu Wang, Beijing (CN); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 39 days.

(21) Appl. No.: 13/132,985

(22) PCT Filed: Feb. 23, 2011

(86) PCT No.: PCT/CN2011/000279
§ 371 (c)(1),
(2), (4) Date: Jun. 6, 2011

(87) PCT Pub. No.: WO2012/022108
PCT Pub. Date: Feb. 23, 2012

(65) Prior Publication Data
US 2012/0043592 A1    Feb. 23, 2012

(30) Foreign Application Priority Data
Aug. 18, 2010  (CN) .......................... 2010 1 0257006

(51) Int. Cl.
H01L 23/48   (2006.01)
H01L 23/52   (2006.01)
H01L 29/40   (2006.01)
H01L 21/4763 (2006.01)

(52) U.S. Cl.
USPC ............ 257/773; 257/751; 438/618; 438/629

(58) Field of Classification Search
USPC .......... 257/773; 438/618, 620, 622, 625–626, 438/629, 642
See application file for complete search history.

(56) References Cited

U.S. PATENT DOCUMENTS

| | | | |
|---|---|---|---|
| 2007/0099414 A1* | 5/2007 | Frohberg et al. | 438/618 |
| 2008/0099921 A1* | 5/2008 | Katata | 257/751 |
| 2009/0159978 A1* | 6/2009 | Matsubara et al. | 257/368 |
| 2011/0062502 A1* | 3/2011 | Yin et al. | 257/288 |

FOREIGN PATENT DOCUMENTS

| | | |
|---|---|---|
| CN | 101471379 A | 7/2009 |
| JP | 2004311537 A * | 11/2004 |

* cited by examiner

*Primary Examiner* — Cheung Lee
*Assistant Examiner* — Jeremy Joy
(74) *Attorney, Agent, or Firm* — Troutman Sanders LLP

(57) ABSTRACT

The present invention provides a semiconductor device. The semiconductor device comprises contact plugs that comprise a first contact plug formed by a first barrier layer arranged on the source and drain regions and a tungsten layer arranged on the first barrier layer; and second contact plugs comprising a second barrier layer arranged on both of the metal gate and the first contact plug and a conductive layer arranged on the second barrier layer. The conductivity of the conductive layer is higher than that of the tungsten layer. A method for forming the semiconductor device is also provided. The present invention provides the advantage of enhancing the reliability of the device when using the copper contact technique.

9 Claims, 6 Drawing Sheets

SEMICONDUCTOR DEVICE AND METHOD FOR FORMING THE SAME

BENEFIT CLAIMS

This application is a US National Stage of International Application No. PCT/CN2011/000279, filed Feb. 23, 2011, which claims the benefit of CN 201010257006.9, filed Aug. 18, 2010.

FIELD OF THE INVENTION

The present invention relates to the technical field of semiconductor, in particular to a semiconductor device and a method for forming the same.

BACKGROUND OF THE INVENTION

When CMOS processing technology node is reduced to 32 nm and below, a metal gate is usually used in the semiconductor device. Such a semiconductor device also comprises a gate dielectric layer 14 carrying a metal gate 16 and a sidewall spacer 18 arranged on both sides of the metal gate 16 as well as the gate dielectric layer 14, the gate dielectric layer 14 and the sidewall spacer 18 being formed on a semiconductor substrate 10. There are isolation regions (e.g. STI) 24 between the individual semiconductor devices. The semiconductor device also comprises source and drain regions 12 and contact plugs 30 (a metal silicide layer 20 is formed on the surface of the source/drain region 12 prior to forming the contact plugs 30). The source/drain regions 12 are located on both sides of the metal gate 16 and are at least partially buried into the semiconductor substrate 10. The contact plug is embedded into an interlayer dielectric layer 22.

Generally, the contact plug can be a tungsten contact plug or a copper contact plug. The copper contact plug comprises a barrier layer 40 and a copper layer 42 that is arranged adjacent to the barrier layer 40. The barrier layer 40 can be made of Ta and/or TaN. The contact plug 30 connected to the source/drain region 12 via the metal silicide 20 as well as the contact plug 32 connected to the metal gate 16 are shown in FIG. 1 and FIG. 2, respectively.

It is found in practice that using a copper contact can effectively reduce the contact resistance, and thus improve the performance of the devices. At the same time, it might induce the risk of degradation of the device reliability, because it is of great possibility to form a copper silicide when copper contacts the metal silicide 20, which will generate voids in the contact plug or even disconnects the plug. Ta and/or TaN has already been used in the copper contact technique to form the barrier layer 40 for preventing copper from diffusing into the metal silicide 20, i.e. using the barrier layer to separate copper from the metal silicide. However, said layer 40 with a limited thickness can hardly achieve effective separation. The main problem to be solved by the present invention is how to enhance the reliability of the device when using the copper contact technique.

SUMMARY OF THE INVENTION

In order to solve the above-mentioned problem, the present invention provides a semiconductor device and method for forming the same, which provides the advantage of enhancing the reliability of the device when using the copper contact technique.

The present invention provides a semiconductor device, which is formed on a semiconductor substrate and comprises a metal gate, source and drain regions and contact plugs, wherein said source and drain regions are located on both sides of the metal gate and are at least partially embedded into the semiconductor substrate, and the contact plugs comprise:

a first contact plug comprising a first barrier layer arranged on the source and drain regions and a tungsten layer arranged on the first barrier layer; and a second contact plug comprising a second barrier layer arranged on both of the metal gate and the first contact plug and a conductive layer arranged on the second barrier layer, wherein the conductivity of the conductive layer is higher than that of the tungsten layer.

Optionally, the conductive layer is a copper layer.

Optionally, the individual second contact plugs are of the same height to the metal gate.

Optionally, the first barrier layer is a layer of Ti and/or TiN.

Optionally, the second barrier layer is a layer of Ta and/or TaN.

The present invention provides a method for forming a semiconductor device. The method comprises the steps of:

forming on the semiconductor substrate a first dielectric layer and planarizing the first dielectric layer, the semiconductor substrate having a metal gate and source and drain regions formed thereon, the source and drain regions being located on both sides of the metal gate and being at least partially buried into the semiconductor substrate, and the first dielectric layer covering the source and drain regions with the metal gate exposed;

forming a first contact hole in the planarized first dielectric layer so as to form a third contact plug after filling said first contact hole with a first barrier layer and a tungsten layer, said first contact hole exposing part of the source and drain regions, the tungsten layer being arranged on the first barrier layer, and the first barrier layer being arranged on the source and drain regions;

forming a second dielectric layer and planarizing the second dielectric layer, the second dielectric layer covering the metal gate, the first dielectric layer, and the third contact plug; and forming a second contact hole in the planarized second dielectric layer so as to form a fourth contact plug after filling said second contact hole with a second barrier layer and a conductive layer, the conductivity of the conductive layer being higher than that of the tungsten layer, the conductive layer being arranged on the second barrier layer, and the second barrier layer being arranged on both of the metal gate and the third contact plug.

Optionally, the step of forming the third contact plug comprises forming the first barrier layer, the tungsten layer, the second barrier layer and the conductive layer in this order so as to fill up the first contact hole, the conductivity of the conductive layer being higher than that of the tungsten layer.

Optionally, the conductive layer is a copper layer.

Optionally, the first barrier layer is a layer of Ti and/or TiN.

Optionally, the second barrier layer is a layer of Ta and/or TaN.

Compared to the prior art, the technical solution of the present invention provides advantages as follows. On the source and drain regions, the conductive layer (e.g. copper layer) is connected to the metal silicide layer with the tungsten layer and the first barrier layer as well as the second barrier layer sandwiched therebetween, which reduces the possibility of a reaction between the conductive layer and the metal silicide layer and enhances the reliability of the device. Meanwhile, on the metal gate, since there is no metal silicide layer, the conductive layer can be connected to the metal gate with only the second barrier layer sandwiched therebetween and none of the tungsten layer and the first barrier layer is needed. As a result, both the reliability and the performance of the device is enhanced.

DETAILED DESCRIPTION OF THE PREFERRED EMBODIMENTS

The following disclosure provides many different embodiments or examples for realizing the technical solution provided by the present invention. Although components and configurations of specific examples are described in the following text, they are merely examples and are not intended to limit the present invention.

In addition, reference numbers and/or letters can be repeated in different embodiments in the present invention for the purpose of concision and clarity, which in itself does not indicate the relationship between the various embodiments and/or configurations that are discussed.

The present invention provides examples of various specific processes and/or materials, but substitution of other processes and/or other materials occurred to those skilled in the art is apparently within the protection scope of the present invention. It shall be noted that the boundaries of the various regions mentioned in this specification include the necessary extension that is made out of the need of process.

Figure 1:
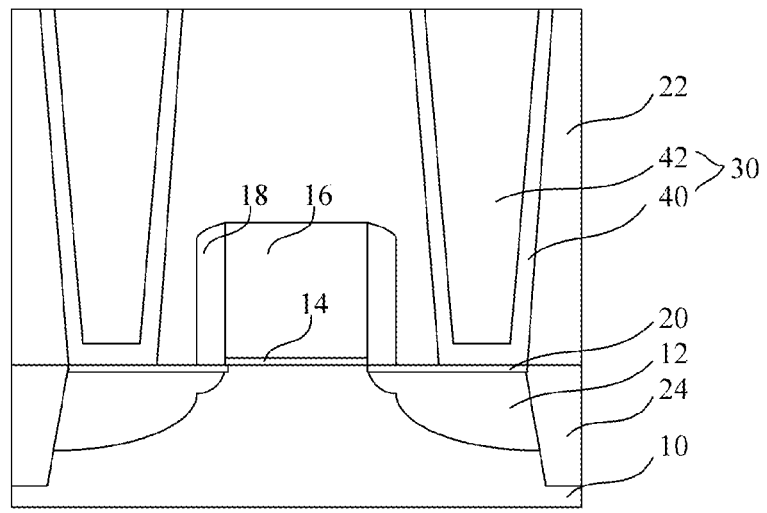
FIG. 1 and FIG. 2 are the sectional views of a semiconductor device structure in the prior art which show the contact plugs arranged on source and drain regions and a metal gate respectively.
Figure 2:
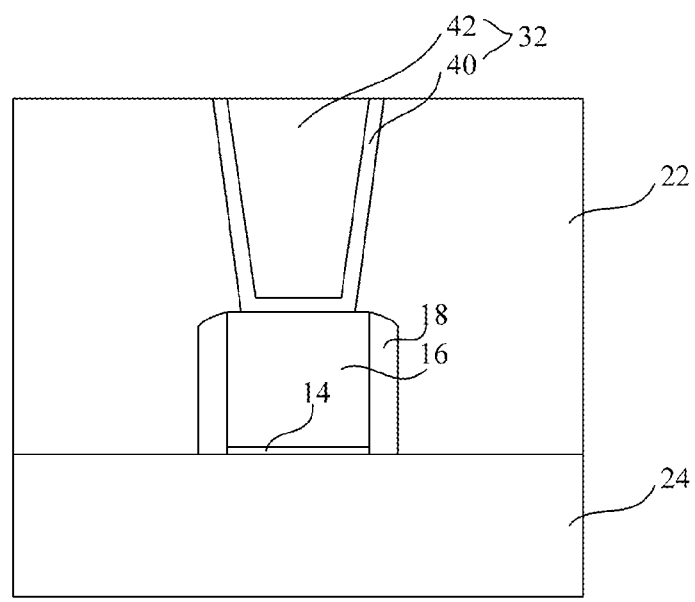
Figure 3:
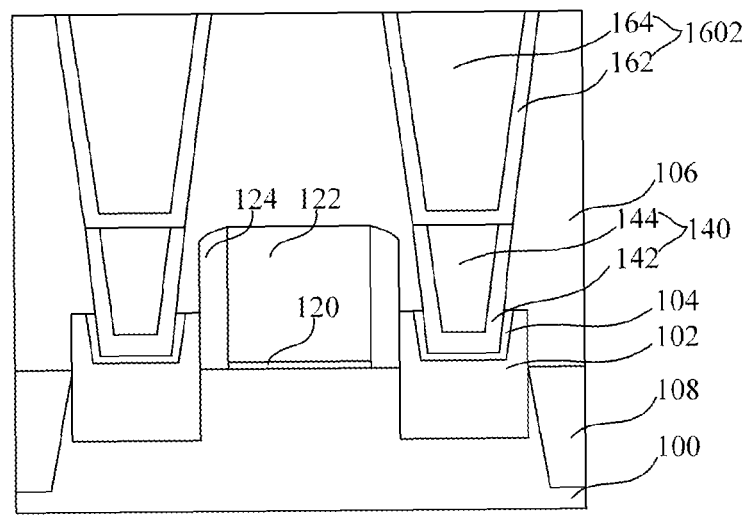
FIGS. 3-5 are the sectional views of the semiconductor device structure in the embodiment of the semiconductor device of the present invention which show the contact plugs arranged on source and drain regions and a metal gate.
Figure 4:
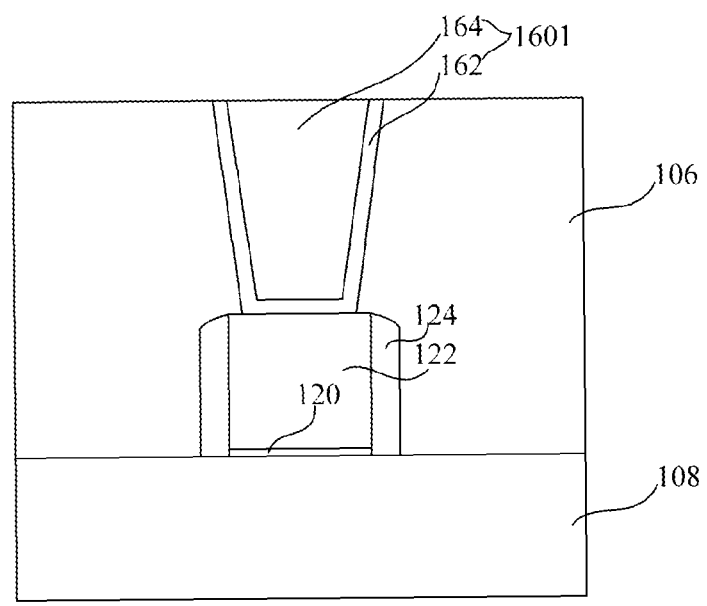

As shown in FIG. 3 and FIG. 4, the present invention provides a semiconductor device (individual semiconductor devices being spaced apart by isolation regions 108) that is formed on a semiconductor substrate 100. The semiconductor device comprises a metal gate 122, source and drain regions 102 and contact plugs. The metal gate 122 is formed on the semiconductor substrate 100 with a gate dielectric layer 120 sandwiched therebetween. The metal gate 122 and the gate dielectric layer 120 are covered by a sidewall spacer 124 on both sides. The source and drain regions 102 are located on both sides of the metal gate 122 and are at least partially embedded into the semiconductor substrate 100. The contact plugs comprise: a first contact plug 140 that is formed from a first barrier layer 142 and a tungsten layer 144, the tungsten layer 144 being arranged adjacent to the first barrier layer 142, while the first barrier layer 142 being arranged adjacent to the source and drain regions 102 (with a metal silicide layer 104 sandwiched therebetween); and a second contact plug 1601/1602 that comprises a second barrier layer 162 and a conductive layer 164, the conductive layer 164 having a conductivity higher than that of the tungsten layer 144, and the conductive layer 164 being arranged adjacent to the second barrier layer 162, while the second barrier layer 162 being arranged adjacent to the metal gate 122 and the first contact plug, respectively. The respective contact plugs are embedded into an interlayer dielectric layer 106.

In the present embodiment, the semiconductor substrate 100 can be a silicon substrate. Preferably, the semiconductor substrate 100 is a silicon epitaxial layer, or the semiconductor substrate 100 can be a silicon-on-insulator (SOI). The metal gate 122 can be formed by a replacement gate (or gate-last) process. The metal gate 122 may include a laminated work function metal layer (e.g. one of TiN, TiAlN, TaN, TaAlN and TaC or a combination thereof) and a metal layer (e.g. one of Ti, Co, Ni, Al and W or a combination thereof). The gate dielectric layer 120 may use a hafnium-based material, such as one of $HfO_2$, HfSiO, HfSiON, HfTaO, HfSiO and HfZrO or a combination thereof. The sidewall spacer 124 may comprise one of silicon nitride, silicon oxide, silicon oxynitride and silicon carbide or a combination thereof. The sidewall spacer 124 may have a multi-layer structure.

The source and drain regions 102 may be formed after implanting ions, such as boron, phosphor or arsenic, into the silicon substrate, and the source and drain regions 102 may be an N-type or a P-type silicon material. The source and drain regions 102 may also be formed by an epitaxial process, in which a contact hole is formed in the silicon substrate first, then an epitaxial growth of the source and drain regions 102 material is performed by using the silicon substrate exposed by the contact hole as the seed crystal. With respect to a PMOS device, the source and drain regions 102 material may be Si or $Si_{1-x}Ge_x$, with x being in the range of 0.1-0.7, for example, 0.2, 0.3, 0.4, 0.5 or 0.6. With respect to an NMOS device, the source and drain regions 102 material may be Si or Si:C, wherein the atom percentage of C can be in the range of 0.2%-2%, for example, 0.5%, 1% or 1.5%. The source and drain regions 102 material can be directly formed by doping a reactant containing doping ions into another reactant used for forming silicon.

It shall be noted that the upper surface of the source and drain regions 102 formed by the epitaxial process may be higher than the interface between the gate dielectric layer 120 and the silicon substrate. In the context of this specification, the upper surface refers to the side parallel to the silicon substrate in any structure, such as the source and drain regions 102 or the first contact plug 140. Contact holes need to be formed in the source and drain regions when subsequently forming the contact plug, and the metal silicide 104 need to be formed at the bottom and on the sidewall of the contact holes. The top surface of the source and drain regions 102 are made to be higher than the interface between the gate dielectric layer 120 and the silicon substrate. In such an arrangement, the contact plug is embedded in the source and drain regions and contacts with the silicide not only via its bottom surface, but also via a portion of its sidewall surface, which further increases the contact area and reduces the contact resistance as compared to the contact plug with a plug bottom landing directly on the surface of the source and drain regions.

The first barrier layer 142 can be a layer of Ti and/or TiN. The conductive layer 164 can be a copper layer, and then the second barrier layer 162 is made of Ta and/or TaN. The conductive layer 164 can also comprise one of cobalt, rhodium, silver, iridium and gold or a combination thereof. Alternatively, the conductive layer 164 can comprise a combination of copper and cobalt, rhodium, silver, iridium or gold. The first barrier layer 142 and the second barrier layer 162 can be formed by CVD (Chemical Vapor Deposition), PVD (Physical Vapor Deposition), PLD (Pulse Laser Deposition), ALD (Atomic Layer Deposition), PEALD (Plasma-Enhanced Atomic Layer Deposition) or other deposition methods. The tungsten layer 144 can be formed by a CVD, ALD, PEALD or sputtering process The conductive layer 164 can be formed by electroplating, MOCVD (Metal Organic Chemical Vapor Deposition), PLD, ALD, PEALD or other appropriate processes.

In this embodiment, the top surface of the first contact plug 140 is on the same level as the top surface of the metal gate 122. In this case, the second contact plug 1601 connected to the metal gate 122 and the second contact plug 1602 connected to the first contact plug 140 are of the same height and thus can be made in one step.

Figure 5:
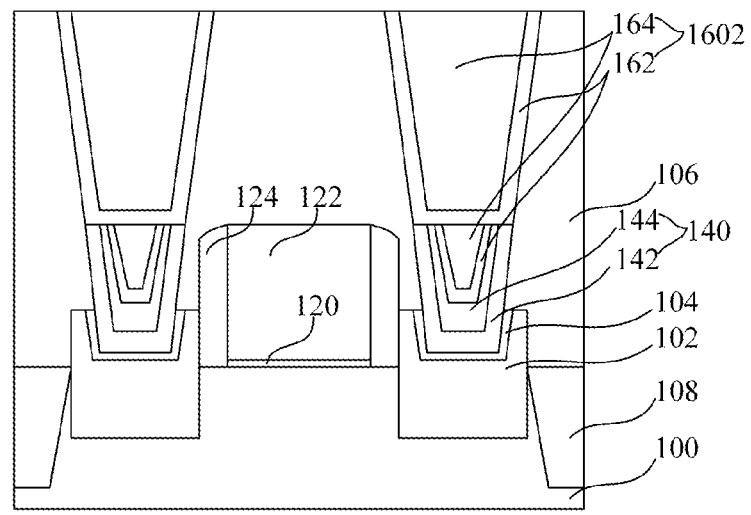

As shown in FIG. 5, in other embodiments, a part of the second contact plug 1602 that is connected to the first contact plug 140 is embedded into the first contact plug 140. In this case, the second contact plug 1602 is not of the same height as the second contact plug 1601 that is connected to the metal gate 122.

On the source and drain regions 102, the conductive layer 164 (e.g. copper layer) is connected to the metal silicide layer 104 via the tungsten layer 144 and the first barrier layer 142 and the second barrier layer 162. The existence of the tungsten layer 144 and the first barrier layer 142 further reduces the risk of the reaction between the conductive layer 164 and the metal silicide layer 104 and enhances the reliability of the device. Meanwhile, on the metal gate 122, the conductive layer 164 lands directly on the surface of the metal gate 122 with only the second barrier layer 162 sandwiched inbetween, because there is no risk of harmful reaction between the conductive layer and the metal gate. As a result, the reliability of the device is enhanced and the resistance of the device is reduced.

The present invention also provides a method for forming a semiconductor device as detailed hereinafter.

Figure 6:
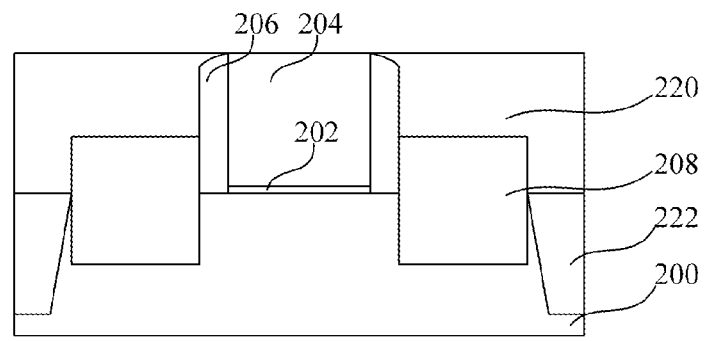
FIG. 6 shows a sectional view of the structure after forming the metal gate in an embodiment of a method for forming the semiconductor device of the present invention.

First, as shown in FIG. 6, a metal gate 204, source and drain regions 208 and a first dielectric layer 220 are formed on a semiconductor substrate 200. The surface of the dielectric and the metal gate is polarized allowing the metal gate exposed. The source and drain regions 208 are located on both sides of the metal gate 204 and being at least partially embedded into the semiconductor substrate 200. The first dielectric layer 220 covers the source and drain regions 208. The individual device regions are separated by isolation regions 222 (e.g. STI).

The metal gate 204 is formed on the gate dielectric layer 202. The sidewall spacer 206 surrounds the metal gate 204 and the gate dielectric layer 202. The gate dielectric layer 202 and the sidewall spacer 206 are formed on the semiconductor substrate 200.

In this embodiment, the semiconductor substrate 200 can be a silicon substrate. Preferably, the semiconductor substrate 200 is a silicon epitaxial layer, or the semiconductor substrate 200 can also be silicon-on-insulator (SOI).

The metal gate 204 can be formed by a replacement-gate (or gate-last) process. The metal gate 204 can be formed by the steps of: firstly, forming on the semiconductor substrate 200 a gate dielectric layer 202 (e.g., one of $HfO_2$, HfSiO, HfSiON, HfTaO, HfSiO and HfZrO or a combination thereof), a dummy gate and a sidewall spacer 206 having a multi-layer structure, such as, one of silicon nitride, silicon oxide, silicon oxynitride and silicon carbide or a combination thereof, the dummy gate being formed on the gate dielectric layer 202, the sidewall spacer 206 being arranged on both sides of the gate dielectric layer 202 and the dummy gate; next, forming a first dielectric layer 220, which covers the dummy gate and the sidewall spacer 206; then, planarizing the first dielectric layer 220 to expose the dummy gate; subsequently, removing the dummy gate (or proceeding with removing the gate dielectric layer 202) to form a contact hole; and finally, forming a work function metal layer (e.g. one of TiN, TiAlN, TaN, TaAlN and TaC or a combination thereof) and a metal layer (e.g. one of Ti, Co, Ni, Al and W or a combination thereof) in this order in the contact hole, and planarizing the work function metal layer and the metal layer to be flush with the first dielectric layer 220 (if the gate dielectric layer 202 has been removed in the previous step, then a gate dielectric layer 202 needs to be formed before forming the work function metal layer). The work function metal layer and the metal layer are not shown in the figures.

As can be seen, when forming the metal gate 204 using the replacement gate process, the first dielectric layer 220 is formed before forming the metal gate 204. In other embodiments, if the metal gate 204 is formed using a gate first process, the first dielectric layer 220 needs to be formed first after forming the metal gate 204 so as to cover the metal gate 204, and then the first dielectric layer 220 is planarized to expose the metal gate 204. The planarization can be performed by a CMP (Chemical Mechanical Planarization) process.

The source and drain regions 208 can be formed by an epitaxial process. In this case, firstly, a contact hole is formed within the silicon substrate and then the epitaxial growth of the source and drain regions 208 material is performed by using the part of the silicon substrate that is exposed by the contact hole as the seed crystal. With respect to a PMOS device, the source and drain regions 208 material may be Si or $Si_{1-x}Ge_x$, with x being in the range of 0.1-0.7, for example, 0.2, 0.3, 0.4, 0.5 or 0.6. With respect to an NMOS device, the source and drain regions 208 material may be Si or Si:C, wherein the atom percentage C can be in the range of 0.2%-2%, for example, 0.5%, 1% or 1.5%. The source and drain regions 208 material can be directly formed by doping a reactant containing doping ions into another reactant used for forming silicon.

The top surface of the source and drain regions 208 formed by the epitaxial process may be higher than the interface between the gate dielectric layer 202 and the silicon substrate. In this case, contact holes need to be formed in the surface of the source and drain regions while subsequently forming the contact plug, and metal silicide needs to be formed at the bottom and on the sidewalls of the contact hole. The top surface of the source and drain regions 208 is made to be higher than the interface between the gate dielectric layer 202 and the silicon substrate. In such an arrangement the contact plug is embedded in the source and drain regions 208 and contacts with the silicide not only via its bottom surface, but also via a portion in its sidewall surface, which further increases the contact area and reduces the contact resistance as compared to the contact plug with a plug bottom landing directly on the surface of the source and drain regions.

In other embodiments, the source and drain regions 208 may be formed after implanting ions, such as doping boron, phosphor or arsenic, into the silicon substrate, and the source and drain regions 102 may be an N-type or a P-type silicon material.

Figure 7:
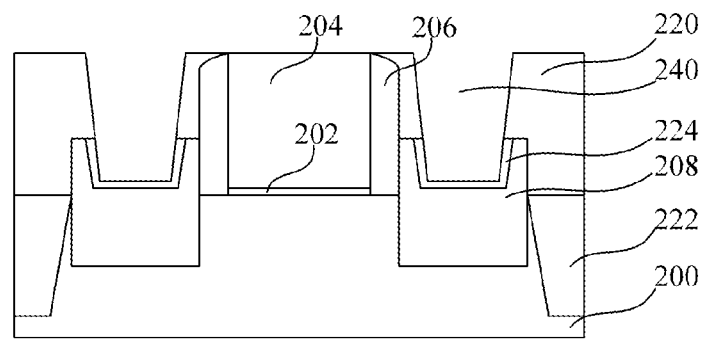
FIG. 7 shows a sectional view of the structure after forming the first contact hole in the embodiment of the method for forming the semiconductor device of the present invention.

Subsequently, as shown in FIG. 7, a first contact hole 240 is formed in the planarized first dielectric layer 220 so as to expose part of the source and drain regions 208 (the first contact hole 240 being embedded into the source and drain regions 208 when the top surface of the source and drain regions 208 is higher than the interface between the gate dielectric layer 202 and the silicon substrate). The first contact hole 240 may be formed by an anisotropic etching process. The metal silicide layer 224 can be formed either after forming the source drain region 208 and before forming the first contact hole 240, or formed after forming the first contact hole 240 (as described in this embodiment).

Figure 8:
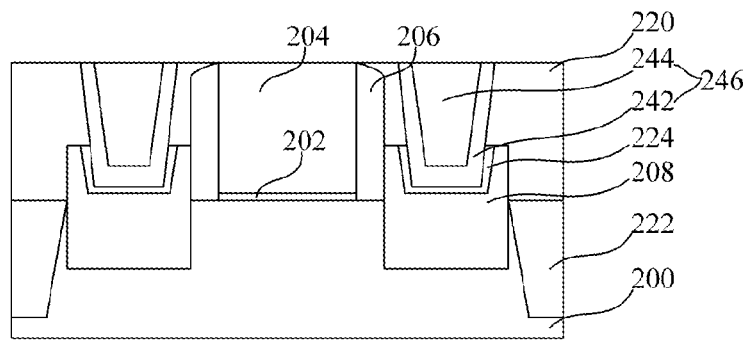
FIGS. 8 and 9 show sectional views of the structures after forming the third contact plug in the embodiment of the method for forming the semiconductor device of the present invention.

Then, as shown in FIG. 8, a first barrier layer 242 and a tungsten layer 244 are formed in this order to fill up the first contact hole 240, and the first barrier layer 242 and the tungsten layer 244 are planarized so as to form a third contact plug 246 after the first dielectric layer 220 is exposed. The first barrier layer 242 can be a layer of Ti and/or TiN. The tungsten layer 244 can be formed by a CVD or or PVD process. In this case, the top surface of the third contact plug 246 (i.e. the first contact plug mentioned in the embodiment of the semiconductor device) is flush with the upper surface of the first dielectric layer 220. The expression of "flush with" means that the height difference between two or more layers (in this embodiment, one layer is the top surface of the third contact plug 246 and the other layer is the top surface of the first dielectric layer 220) is within the range of the process tolerance.

Figure 9:
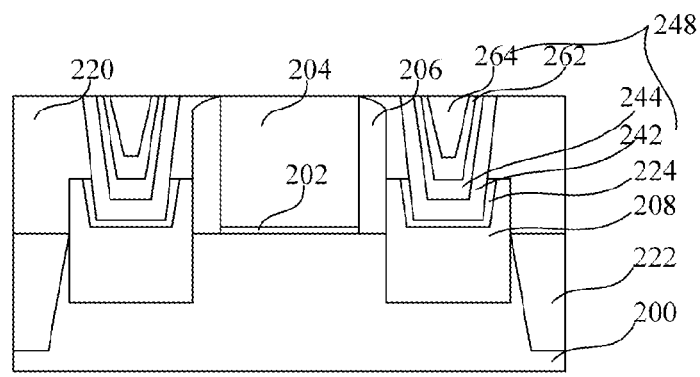

In other embodiments, as shown in FIG. 9, a first barrier layer 242, a tungsten layer 244, a second barrier layer 262 and a conductive layer 264 are formed in this order to fill up the first contact hole 240. The first barrier layer 242, the tungsten layer 244, the second barrier layer 262 and the conductive layer 264 are planarized so as to form a third contact plug 248 after the first dielectric layer 220 is exposed. In this case, the tungsten layer 244 can be as thin as possible to reduce the resistance of the device, as long as it can avoid the reaction between the conductive layer 253 (e.g. copper layer) and the metal silicide layer 224 formed on the surface of the source and drain regions 208 so as to enhance the reliability of the device.

The conductive layer 264 can be a copper layer, and then the second barrier layer 262 is a layer of Ta and/or TaN. The conductive layer 264 can also comprise one of cobalt, rhodium, silver, iridium and gold or a combination thereof. Alternatively, the conductive layer 264 can be a combination of copper and cobalt, rhodium, silver, iridium or gold. The first barrier layer 242 and the second barrier layer 262 can be formed by CVD, PVD, PLD, ALD, PEALD or other deposition processes. The tungsten layer 244 can be formed by a CVD or PVD process. The conductive layer 264 can be formed by electroplating, MOCVD, PLD, ALD, PEALD or other appropriate processes.

Figure 10:
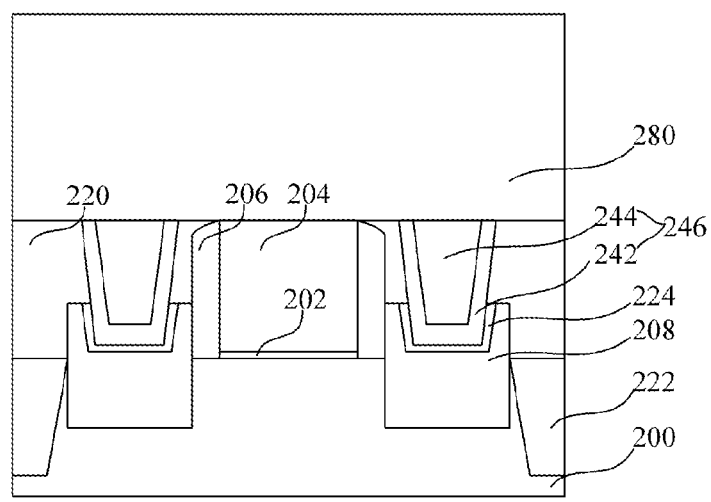
FIG. 10 shows a sectional view of the structure after forming the second dielectric layer in the embodiment of the method for forming the semiconductor device of the present invention.

Then, as shown in FIG. 10, a second dielectric layer 280 is formed so as to cover the metal gate 204, the first dielectric layer 220 and the third contact plug 246 (or 248), and is then planarized.

The first dielectric layer 220 and the second dielectric layer 280 can each comprise one of silicon oxide (USG), doped silicon oxide (e.g. fluorosilicate glass, borosilicate glass, phosphosilicate glass, or boron-phosphorosilicate glass), low-k dielectric material (e.g. framesite, coral, etc.) or a combination thereof. The first dielectric layer 220 and the second dielectric layer 280 may each have a multi-layer structure. The first dielectric layer 220 and the second dielectric layer 280 may be of the same or different material.

Figure 11:
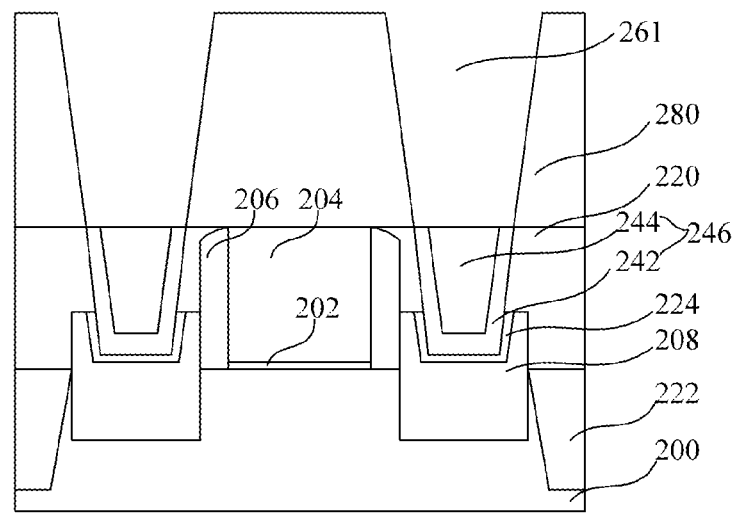
FIGS. 11 and 12 are the sectional views of the structures which show the second contact holes that expose the source and drain regions and the metal gate respectively in the embodiment of the method for forming the semiconductor device of the present invention.
Figure 12:
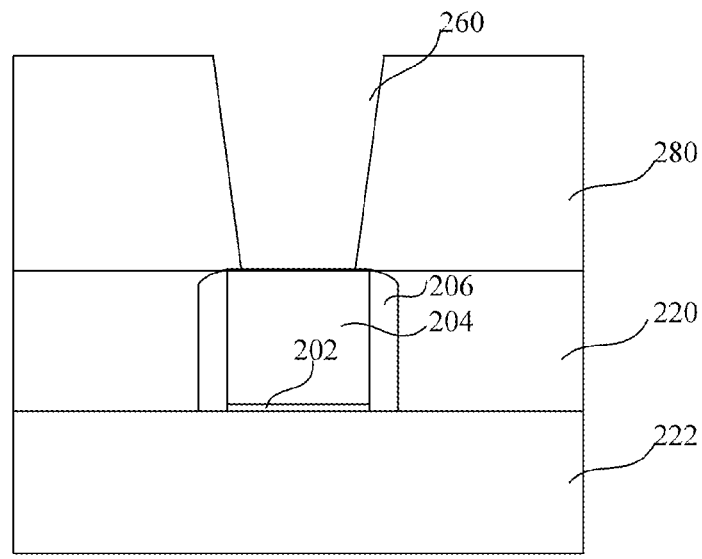

Next, as shown in FIGS. 11 and 12, a second contact hole 260/261 is formed in the planarized second dielectric layer 280 so as to expose the metal gate 204 and the third contact plug 246 (or 248). The second contact hole 260/261 may be formed by an anisotropic etching process.

Figure 13:
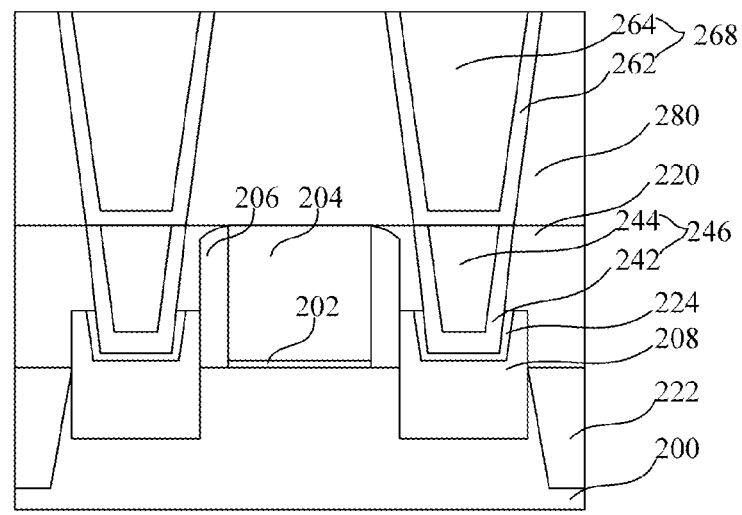
FIGS. 13 and 14 are the sectional views of the structures which show the fourth contact plugs connected to the third contact plug and to the metal gate respectively in the embodiment of the method for forming the semiconductor device of the present invention.
Figure 14:
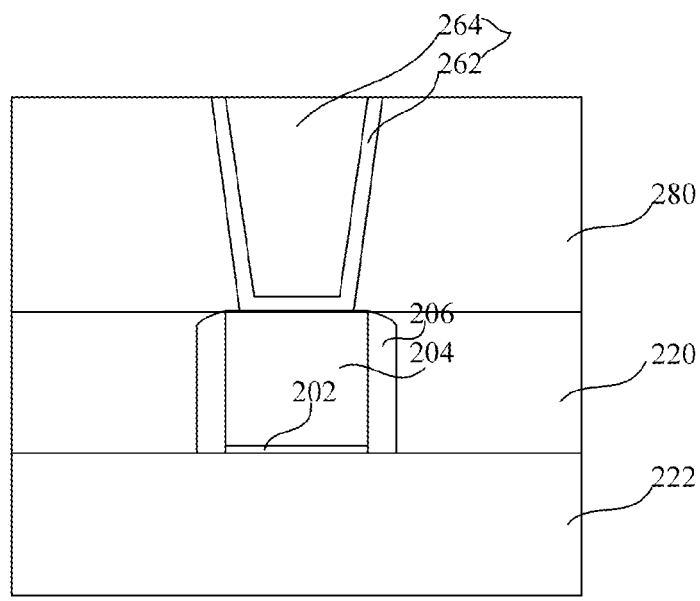

Afterwards, as shown in FIGS. 13 and 14, the second barrier layer 262 and the conductive layer 264 are formed in this order to fill up the second contact hole 260/261, and are planarized so as to form a fourth contact plug 266/268 after the second dielectric layer 280 is exposed.

On the source and drain regions, the conductive layer (e.g. copper layer) is connected to the metal silicide layer via the tungsten layer and the first barrier layer, and the second barrier layer. The existence of the tungsten layer 144 and the first barrier layer 142 further reduces the risk of the a reaction between the conductive layer and the metal silicide layer and enhances the reliability of the device. Meanwhile on the metal gate, the conductive layer lands directly on the surface of the metal gate with only the second barrier layer sandwiched inbetween, because there is no risk of harmful reaction between the conductive layer and the metal gate. As a result, the reliability of the device is enhanced and the resistance of the device is reduced.

In addition, the scope to which the present invention is applied is not limited to the process, mechanism, manufacture, material composition, means, methods and steps described in the specific embodiments in the specification. A person of ordinary skill in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the teach of the present invention without departing from the protection scope thereof.

What is claimed is:

1. A semiconductor device, which is formed on a semiconductor substrate and comprises a metal gate, source and drain regions and contact plugs, wherein said source and drain regions are located on both sides of the metal gate and are at least partially embedded into the semiconductor substrate, the contact plugs comprise:

first contact plugs comprising a first barrier layer arranged on the source and drain regions, a tungsten layer arranged on the first barrier layer, a second barrier layer arranged on the tungsten layer, and a conductive layer arranged on the second barrier layer; and second contact plugs comprising the second barrier layer arranged on both of the metal gate and the first contact plugs and the conductive layer arranged on the second barrier layer of the second contact plug arranged on the first contact plug, wherein the second barrier layer and the conductive layer are arranged both in the first contact plug on the tungsten layer and in the second contact plug on the metal gate and the first contact plug, and wherein the conductivity of the conductive layer is higher than that of the tungsten layer.

2. The semiconductor device according to claim 1, characterized in that the conductive layer is a copper layer.

3. The semiconductor device according to claim 1, characterized in that the individual second contact plugs are of different heights.

4. The semiconductor device according to claim 1, characterized in that the first barrier layer is a layer of Ti and/or TiN.

5. The semiconductor device according to claim 1, characterized in that the second barrier layer is a layer of Ta and/or TaN.

6. A method for forming a semiconductor device, comprising the steps of: forming on the semiconductor substrate a first dielectric layer and planarizing the first dielectric layer, the semiconductor substrate having a metal gate and source and drain regions formed thereon, the source and drain regions being located on both sides of the metal gate and being at least partially buried into the semiconductor substrate, and the first dielectric layer covering the source and drain regions with the metal gate exposed;

forming a first contact hole exposing part of the source and drain regions in the planarized first dielectric layer, and filling said first contact hole with a first barrier layer, a tungsten layer, a second barrier layer and a conductive layer in this order to form a third contact plug, wherein the first barrier layer is arranged on the source and drain regions, and the conductivity of the conductive layer is higher than that of the tungsten layer;

forming a second dielectric layer and planarizing the second dielectric layer, the second dielectric layer covering the metal gate, the first dielectric layer, and the third contact plug; and forming a second contact hole in the planarized second dielectric layer so as to form a fourth contact plug after filling said second contact hole with the second barrier layer and the conductive layer, the conductivity of the conductive layer being higher than that of the tungsten layer, the conductive layer being arranged on the second barrier layer, and the second barrier layer being arranged on both of the metal gate and the third contact plug.

7. The method according to claim 6, characterized in that the conductive layer is a copper layer.

8. The method according to claim 6, characterized in that the first barrier layer is a layer of Ti and/or TiN.

9. The method according to claim 6, characterized in that the second barrier layer is a layer of Ta and/or TaN.

* * * * *